United States Patent [19]

Ota et al.

[11] Patent Number: 5,223,965
[45] Date of Patent: Jun. 29, 1993

[54] ELECTRODE CONNECTING DEVICE OF LIQUID CRYSTAL DISPLAY ELEMENT HAVING A PROTECTING FILM FOR ABSORBING STRESS APPLIED TO THE ELECTRODE AT A THERMAL PRESS-FIXING TIME

[75] Inventors: Yuichi Ota; Takumi Suzuki, both of Atsugi; Yuji Narumi, Kiyokawa; Satoshi Taguchi, Yamato, all of Japan

[73] Assignee: Ricoh Company, Ltd., Tokyo, Japan

[21] Appl. No.: 911,059

[22] Filed: Jul. 9, 1992

[30] Foreign Application Priority Data

Jul. 23, 1991 [JP] Japan ............... 3-182353

[51] Int. Cl.$^5$ .................... G02F 1/13
[52] U.S. Cl. ........................ 359/88
[58] Field of Search .............. 359/81, 82, 87, 88

[56] References Cited

U.S. PATENT DOCUMENTS

| 4,832,455 | 5/1989 | Takeno et al. | 359/88 |
| 4,964,700 | 10/1990 | Takabayashi | 359/88 |

FOREIGN PATENT DOCUMENTS

| 59-149327 | 8/1984 | Japan . | |
| 60-225828 | 11/1985 | Japan . | |
| 62-35473 | 2/1987 | Japan . | |
| 63-8633 | 1/1988 | Japan . | |
| 64-54739 | 3/1989 | Japan . | |
| 0235922 | 9/1989 | Japan | 359/88 |
| 4-39625 | 2/1992 | Japan . | |

Primary Examiner—William L. Sikes
Assistant Examiner—Huy K. Mai
Attorney, Agent, or Firm—Oblon, Spivak, McClelland, Maier & Neustadt

[57] ABSTRACT

An electrode connecting device of a liquid crystal display element connects a transparent electrode terminal formed on a substrate constructed by a flexible film to an electrode terminal of a driving circuit and an external circuit through an anisotropic conductive film. The electrode connecting device has a protecting film formed on a surface of a connecting portion on which the transparent electrode terminal is formed. The protecting film can absorb stress applied to the transparent electrode at a thermal press-fixing time and can move conductive particles within the anisotropic conductive film. Both the electrodes are electrically connected to each other through the conductive particles within the anisotropic conductive film extending through the protecting film. The protecting film may be disposed on only the transparent electrode. A peripheral substrate portion around both the connected electrodes may be covered with another protecting film.

8 Claims, 8 Drawing Sheets

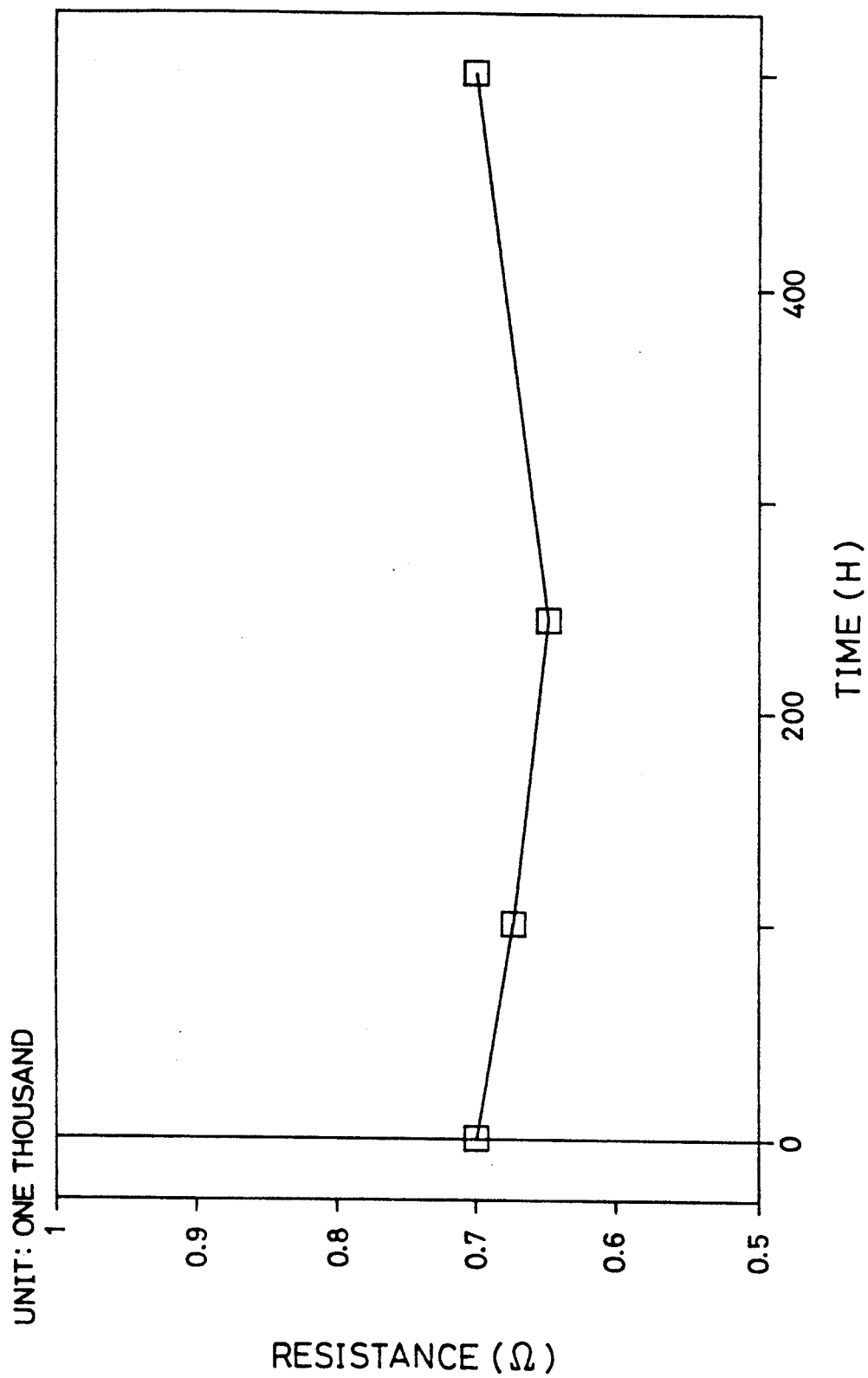

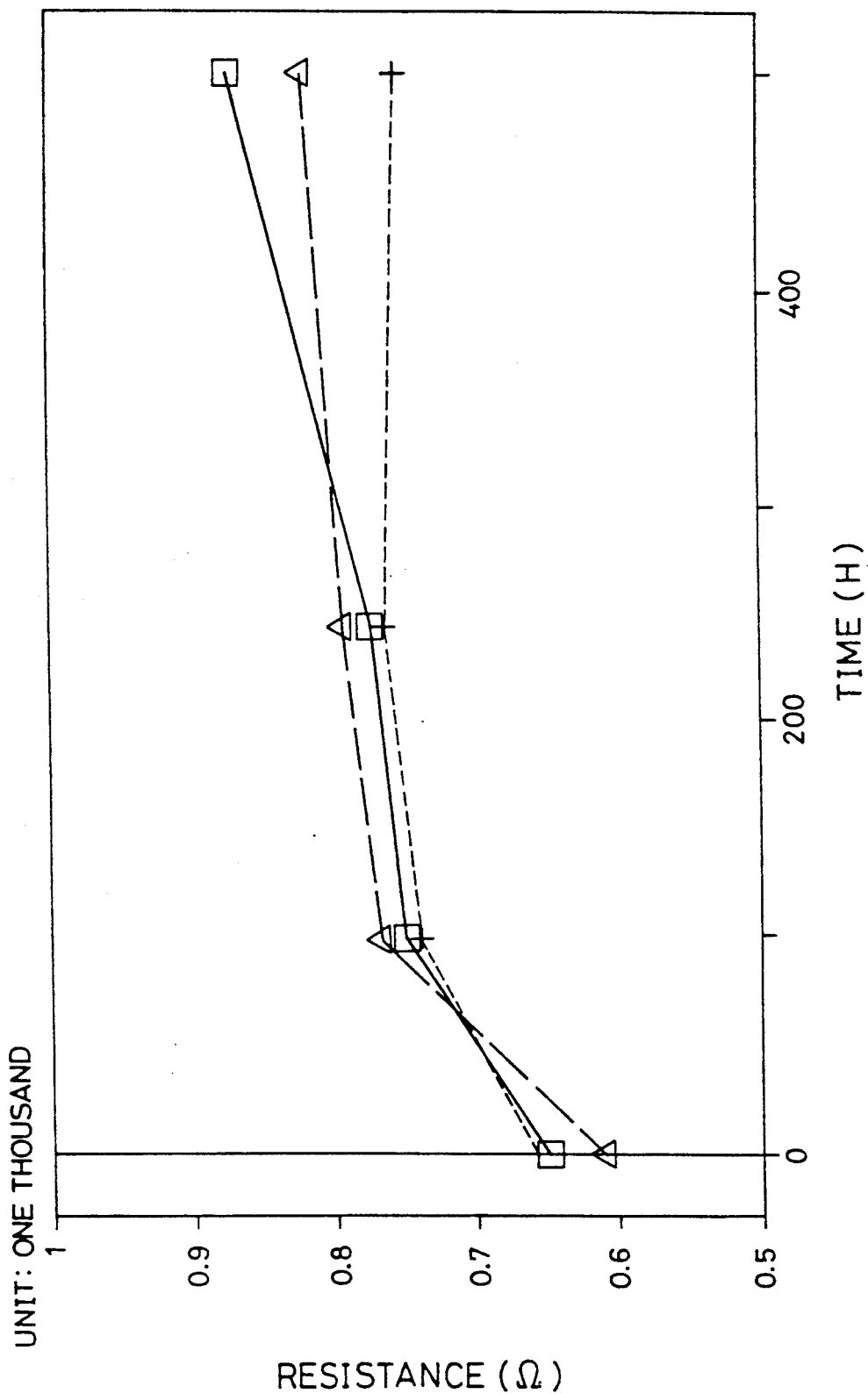

ELECTRODE CONNECTING DEVICE OF LIQUID CRYSTAL DISPLAY ELEMENT HAVING A PROTECTING FILM FOR ABSORBING STRESS APPLIED TO THE ELECTRODE AT A THERMAL PRESS-FIXING TIME

BACKGROUND OF THE INVENTION

1. Field of the Invention

The present invention relates to a device for electrically connecting a connecting terminal portion of a transparent electrode to an electrode connecting portion formed on a substrate of a driving circuit, etc. in a liquid crystal display element in which each of upper and lower substrates is constructed by a flexible film.

2. Description of the Related Art

In a conventional liquid crystal display element having a flexible film as a substrate, an anisotropic conductive film is used when a driving circuit is electrically connected to a transparent electrode formed on one substrate. The anisotropic conductive film is formed by dispersing conductive particles having several microns in diameter into an adhesive. The transparent electrode and the driving circuit are electrically connected to each other through the anisotropic conductive film by pressure welding or thermal press-fixing.

In a conventional electrode connecting means of the liquid crystal display element, adhesive force of the transparent electrode supported by the flexible film substrate is weak in comparison with that in the electrode connection of a liquid crystal display element constructed by forming the transparent electrode on a glass substrate. Accordingly, when an opposite electrode of the driving circuit is connected to the flexible film having such a transparent electrode, the transparent electrode on the flexible film tends to be disconnected and deteriorated by pressure and thermal stresses.

A peripheral substrate portion in a connecting portion may be coated with a backup agent such as a processing agent to prevent the connecting portion from being peeled. For example, the processing agent as a backup agent is constructed by a rubber adhesive or an adhesive of a UV effect type. There are no effects obtained by using the backup agent at an initial stage of time passage. This is probably because the transparent electrode is already damaged at a thermal press-fixing time so that the above effects cannot be obtained even when the backup agent is used after a thermal press-fixing operation. In a thermal press-fixing portion having no backup agent, the resistance value of a connecting terminal is continuously increased in accordance with the passage of an operating time. In this state, it is assumed that no signal waveforms are sharpened and the connecting terminal is not conductive and is in a disconnecting state.

SUMMARY OF THE INVENTION

It is therefore an object of the present invention to provide an electrode connecting device of a liquid crystal display element in which an increase in connection resistance in a state of high temperature and humidity is restrained in a connecting terminal portion between a transparent electrode of the liquid crystal display element and an opposite electrode of a substrate on the side of a driving circuit, etc. so that it is possible to prevent disconnection and deterioration of the connecting terminal portion caused by a thermal press-fixing stress, and improve reliability of the terminal connecting portion for a long period.

The above object of the present invention can be achieved by an electrode connecting device of a liquid crystal display element for connecting a transparent electrode terminal formed on a substrate constructed by a flexible film to an electrode terminal of a driving circuit, an external circuit, etc. through an anisotropic conductive film, the electrode connecting device comprising a protecting film formed on a surface of a connecting portion on which the transparent electrode terminal is formed; the protecting film being able to absorb stress applied to the transparent electrode at a thermal press-fixing time and move conductive particles within the anisotropic conductive film; and both the electrodes being electrically connected to each other through the conductive particles within the anisotropic conductive film extending through the protecting film.

The above object of the present invention can be also achieved by an electrode connecting device of a liquid crystal display element for connecting a transparent electrode terminal formed on a substrate constructed by a flexible film to an electrode terminal of a driving circuit, an external circuit, etc. through an anisotropic conductive film, the electrode connecting device comprising a protecting film formed on a surface of a connecting portion on which the transparent electrode terminal is formed; the protecting film being able to absorb stress applied to the transparent electrode at a thermal press-fixing time and move conductive particles within the anisotropic conductive film; both the electrodes being electrically connected to each other through the conductive particles within the anisotropic conductive film extending through the protecting film; and a peripheral substrate portion around both the connected electrodes being covered with another protecting film.

In accordance with the above structure of the electrode connecting device of the liquid crystal display element in the present invention, the protecting film is arranged on the transparent electrode formed on the substrate composed of a flexible film. The anisotropic conductive film is arranged between this substrate and a driving circuit substrate. The transparent electrode and an opposite electrode are aligned with each other and are thermally press-fixed to each other. The protecting film is constructed by a material which can absorb stress applied to the transparent electrode at a thermal press-fixing time and can move the conductive particles within the anisotropic conductive film. Accordingly, it is possible to prevent disconnection and deterioration of an electrode connecting portion. Further, it is possible to restrain an increase in connecting resistance value of the electrode connecting portion and improve reliability of the electrode connecting device.

Further objects and advantages of the present invention will be apparent from the following description of the preferred embodiments of the present invention as illustrated in the accompanying drawings.

BRIEF DESCRIPTION OF THE DRAWINGS

FIG. 3 is a graph showing a change in resistance value of the transparent electrode formed on a substrate in a test in which the connecting terminal portion of the transparent electrode is left at high temperature and humidity;

FIG. 4 is a graph showing a change in resistance value of the transparent electrode in a test in which the connecting terminal portions are left at high temperature and humidity after the connecting terminal portion of a substrate in a liquid crystal display element is connected to the connecting terminal portion of the driving circuit substrate;

DESCRIPTION OF THE PREFERRED EMBODIMENTS

The preferred embodiments of an electrode connecting device of a liquid crystal display element in the present invention will next be described in detail with reference to the accompanying drawings.

Figure 1A:
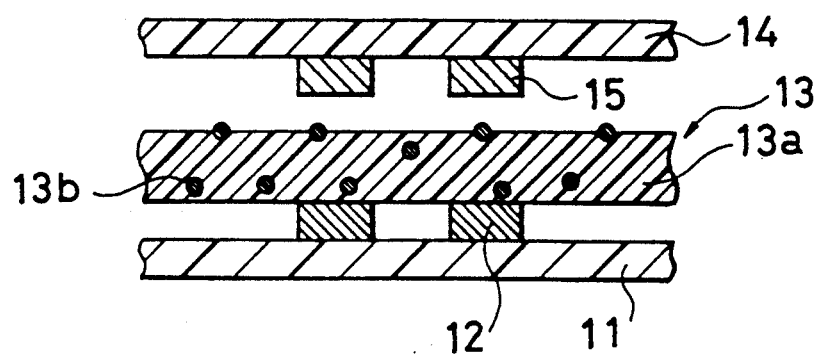
FIG. 1a is a partially broken cross-sectional view of a conventional liquid crystal display before a connecting terminal portion of a transparent electrode is connected to a connecting terminal portion of a substrate of a driving circuit.
Figure 1B:
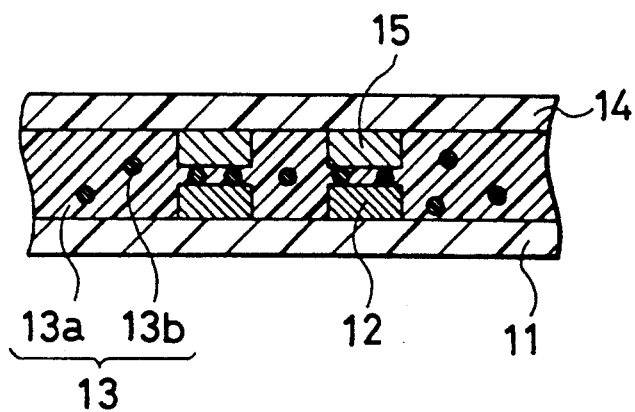
FIG. 1b is a partially broken cross-sectional view of the conventional liquid crystal display after the connecting terminal portion of the transparent electrode is connected to the connecting terminal portion of the driving circuit substrate.

As shown in FIG. 1a, each of upper and lower substrates is constructed by polyethylene terephthalate (which is called PET in the following description). An anisotropic conductive film 13 is formed on a transparent electrode 12 formed as a connecting portion on a flexible film 11 constituting one substrate. An opposite electrode 15 is formed on a base film 14 on the side of a driving circuit and is aligned with the above transparent electrode 12. As shown in FIG. 1b, the opposite electrode 15 is thermally press-fixed to the transparent electrode 12. In the anisotropic conductive film 13, conductive particles 13b having several microns in diameter are dispersed into an adhesive 13a composed of thermosetting resin or thermoplastic resin.

Figure 2A:
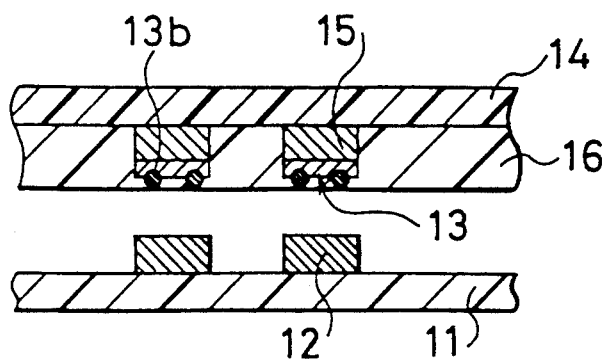
FIG. 2a is a partially broken cross-sectional view of another conventional liquid crystal display before a connecting terminal portion of a transparent electrode is connected to a connecting terminal portion of a substrate of a driving circuit.
Figure 2B:
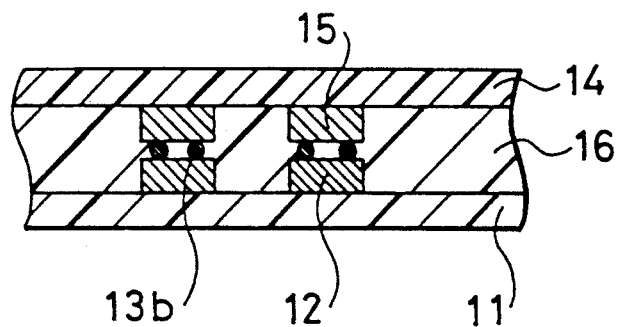
FIG. 2b is a partially broken cross-sectional view of this another conventional liquid crystal display after the connecting terminal portion of the transparent electrode is connected to the connecting terminal portion of the driving circuit substrate.

FIG. 2a and 2b show another conventional example of the connecting portion between the transparent electrode and the opposite electrode. In this example, a transparent electrode 12 is formed on a PET film 11 constituting one substrate of a liquid crystal display element. An anisotropic conductive film 13 is printed on an opposite electrode 15 on a base film 14 on the side of a driving circuit. Thereafter, an adhesive 16 having a constant thickness is printed on the base film 14. The opposite electrode 15 formed on the base film 14 is aligned with the above transparent electrode 12 and is thermally press-fixed to this transparent electrode 12.

In the conventional electrode connecting means of the liquid crystal display element, adhesive force of the transparent electrode supported by the flexible film substrate is weak in comparison with that in the electrode connection of a liquid crystal display element constructed by forming the transparent electrode on a glass substrate. Accordingly, when the opposite electrode of the driving circuit is connected to the flexible film having such a transparent electrode, the transparent electrode on the flexible film tends to be disconnected and deteriorated by pressure and thermal stresses.

FIG. 3 shows a change in resistance of the transparent electrode (ITO) in accordance with the results of a test in which a connecting terminal portion of the transparent electrode is left at high temperature and humidity such as 60° C. and 90% RH. In FIG. 3, a square □ shows a resistance value of the transparent electrode when no thermal pressure is applied to a substrate unit. As can be seen from this graph, the resistance value of the transparent electrode is almost stabilized without any change in resistance in the case of the substrate unit to which no thermal pressure is applied.

In contrast to this, FIG. 4 shows a change in resistance value of the transparent electrode in accordance with the results of a test in which a tested material is left at high temperature and humidity such as 60° C. and 90% RH. This tested material may be constructed by connecting the driving circuit substrate and the connecting terminal portion of the transparent electrode formed on the flexible film to each other by a heat seal connector manufactured by Japan Graphite. In this case, no tested material is processed. After this connection using the heat seal connector, a peripheral portion of the substrate in a connecting portion may be coated with a backup agent such as each of processing agents A and B to prevent the connecting portion from being peeled. In FIG. 4, a square □, a plus + and a triangle Δ respectively show the resistance value of the transparent electrode with respect to no processing, processing agent A and processing agent B.

The processing agent A as a backup agent is constructed by a rubber adhesive and the processing agent B as a backup agent is constructed by an adhesive of a UV effect type. As can be seen from this graph, there are no effects obtained by using the backup agent at an initial stage of time passage. This is probably because the transparent electrode is already damaged at a thermal press-fixing time so that the above effects cannot be obtained even when the backup agent is used after a thermal press-fixing operation. In a thermal press-fixing portion having no backup agent, the resistance value of a connecting terminal is continuously increased in accordance with the passage of an operating time. In this state, it is assumed that no signal waveforms are sharpened and the connecting terminal is not conductive and is in a disconnecting state.

Figure 5:
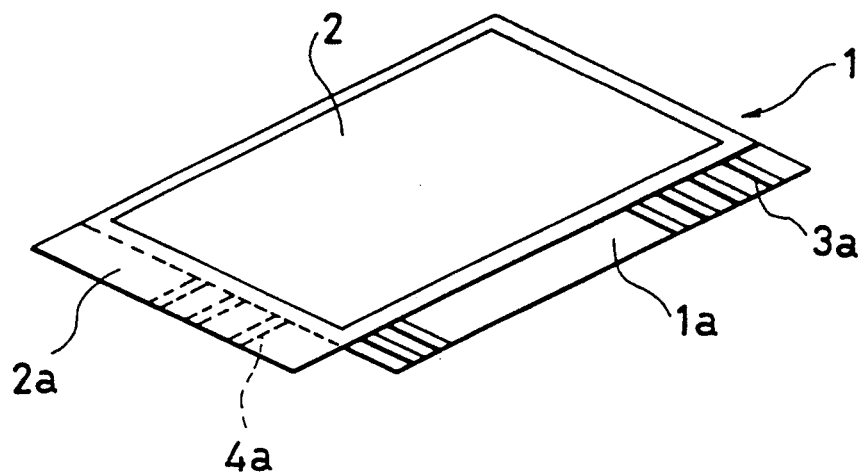
FIG. 5 is a schematic perspective view of a liquid crystal display element in the present invention before a driving circuit is connected to the liquid crystal display element in a liquid crystal display.

FIG. 5 is a perspective view showing the entire construction of a liquid crystal display element to which the present invention is applied. In FIG. 5, each of a lower substrate 1 and an upper substrate 2 is constructed by a flexible PET film made of polyethylene terephthalate (PET). Transparent electrodes 3 and 4 are formed on opposite faces of the substrates 1 and 2 such that these electrodes are perpendicular to each other. Each of the electrodes 3 and 4 is constructed by a transparent electrode film (ITO) composed of a solid solution of indium oxide and tin oxide. An orientation agent is printed on each of the transparent electrodes 3 and 4 formed on the respective substrates 1 and 2. Further, orientation rubbing processing is performed with respect to the printed orientation agent. Thereafter, both the substrates 1 and 2 are stuck to each other through a gap material by using a sealant. A liquid crystal is then sealed into a space between the substrates 1 and 2, thereby obtaining a liquid crystal display element. The above operation is similar to that in the conventional case.

In such a liquid crystal display element, a portion 1a of the lower substrate 1 is projected from the upper substrate 2. A transparent electrode connecting terminal portion 3a is disposed in the substrate portion 1a and is connected to the connecting terminal portion of a driving circuit substrate 8 described later. Similarly, a substrate potion 2a is projected from the upper substrate 2. A transparent electrode connecting terminal portion 4a is disposed in this substrate portion 2a.

Figure 8:
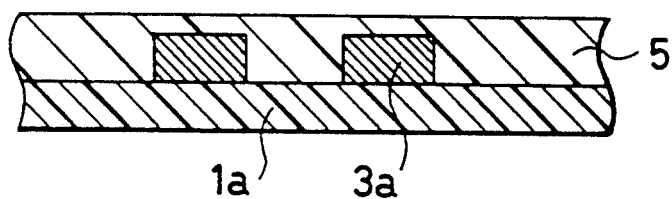
FIG. 8 is a cross sectional view showing the connecting terminal portion of the transparent electrode in one embodiment of the present invention in which a protecting film is formed on one substrate of the liquid crystal display element shown in FIG. 5.

FIG. 8 shows a cross section of the transparent electrode connecting terminal portion 3a formed on the projected substrate portion 1a of the lower substrate 1 shown in FIG. 5 in accordance with the present invention. A protecting film 5 is formed on the substrate portion 1a including this transparent electrode connecting terminal portion 3a thereon. A material of the protecting film 5 is constructed such that no stress applied to an anisotropic conductive film 6 located between the connecting terminal portion of the driving circuit substrate 8 and the protecting film 5 at a thermal press-fixing time is directly applied to the above transparent electrodes 3 and 4. Further, this material of the protecting film 5 is constructed such that conductive particles 6a within the anisotropic conductive film 6 can extend through the transparent electrode connecting terminal portion 3a.

For example, this material of the protecting film 5 can be formed by drying a solvent having polyurethane resin or polyolefin resin as a basic material. The material of the projecting film 5 can be also formed by using the orientation agent formed on the opposite face of each of the substrates.

Figure 6:
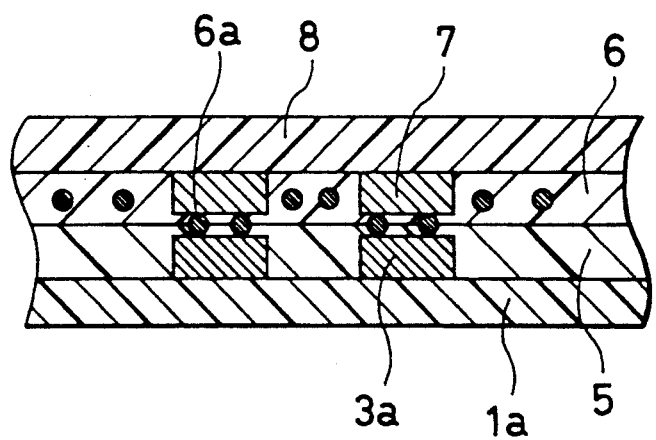
FIG. 6 is a partially broken cross-sectional view of the liquid crystal display element in the present invention in which a connecting terminal portion of a transparent electrode is connected to a connecting terminal portion of a substrate of a driving circuit.
Figure 7:
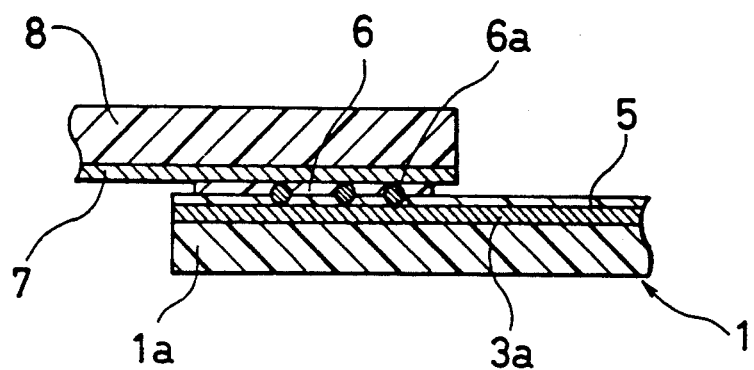
FIG. 7 is a cross-sectional view showing a cross section of the liquid crystal display element in the present invention perpendicular to that shown in FIG. 6.

FIG. 6 shows an electrode connecting device of a liquid crystal display element in accordance with a first embodiment of the present invention. In this embodiment, an opposite electrode 7 on the driving circuit substrate 8 is connected through the anisotropic conductive film 6 to a structure obtained by forming the protecting film 5 on the transparent electrode connecting terminal portion 3a of the lower substrate portion 1a as shown in FIG. 8. FIG. 7 shows a cross section perpendicular to that shown in FIG. 6. In FIG. 5, each of the lower and upper substrates 1 and 2 is constructed by using a PET film having about 0.1 mm in thickness. The transparent electrode connecting terminal portion 3a having about 0.2 μm in thickness is formed on the projected substrate portion 1a of the lower substrate 1. The substrate portion 1a having this transparent electrode connecting terminal portion 3a thereon is coated with a solution having about 2 to 4 μm in thickness. This solution is constructed by using polyurethane resin as a basic material and is diluted by toluene or ethyl acetate. After this solution or solvent is coated and dried, this solution is provided as the protecting film 5.

The thickness of this coated solution is suitably changed in accordance with a diameter of each of the conductive particles 6a in the anisotropic conductive film 6. The thickness of the solution coated on the transparent electrode connecting terminal portion 3a is preferably set to be smaller than the diameter of each of the conductive particles 6a since the connecting terminal portion of the driving circuit substrate 8 is clearly connected electrically to the transparent electrode connecting terminal portion 3a through the conductive particles 6a. The protecting film 5 may be constructed as another example by a solution using polyolefin resin as a basic material and diluted by toluene or xylene instead of the solution using polyurethane resin as a basic material.

The anisotropic conductive film 6 is arranged on the substrate portion 1a having the protecting film 5 thereon. The driving circuit substrate 8 has the opposite electrode 7 aligned with the transparent electrode connecting terminal portion 3a on the substrate portion 1a. This driving circuit substrate 8 is arranged on the anisotropic conductive film 6. When the substrate portion 1a is thermally press-fixed to the driving circuit substrate 8, a thermal press-fixing stress is absorbed into the protecting film 5. Thus, it is possible to prevent disconnection and deterioration of the transparent electrode connecting terminal portion 3a caused by the above stress in the conventional electrode connecting device without directly applying this stress to the transparent electrode connecting terminal portion 3a. In this case, the conductive particles 6a of the anisotropic conductive film 6 extend through the protecting film 5 so that the transparent electrode connecting terminal portion 3a is electrically connected to the opposite electrode 7 through the conductive particals 6a. The transparent electrode connecting terminal portion 3a is stuck to the substrate portion 1a as a flexible film by a weak adhesive force. This transparent electrode connecting terminal portion 3a is electrically connected to the opposite electrode 7 in a state in which the transparent electrode connecting terminal portion 3a is protected by the protecting film 5. Accordingly, it is possible to prevent the transparent electrode connecting terminal portion 3a from being disconnected and deteriorated. FIG. 6 shows a cross section of a connecting portion after the transparent electrode connecting terminal portion 3a is completely connected to the opposite electrode 7. The protecting film 5 used in this embodiment is constructed by using an electrical insulating material so that there is no leak between adjacent electrodes and display quality is improved.

Figure 10:
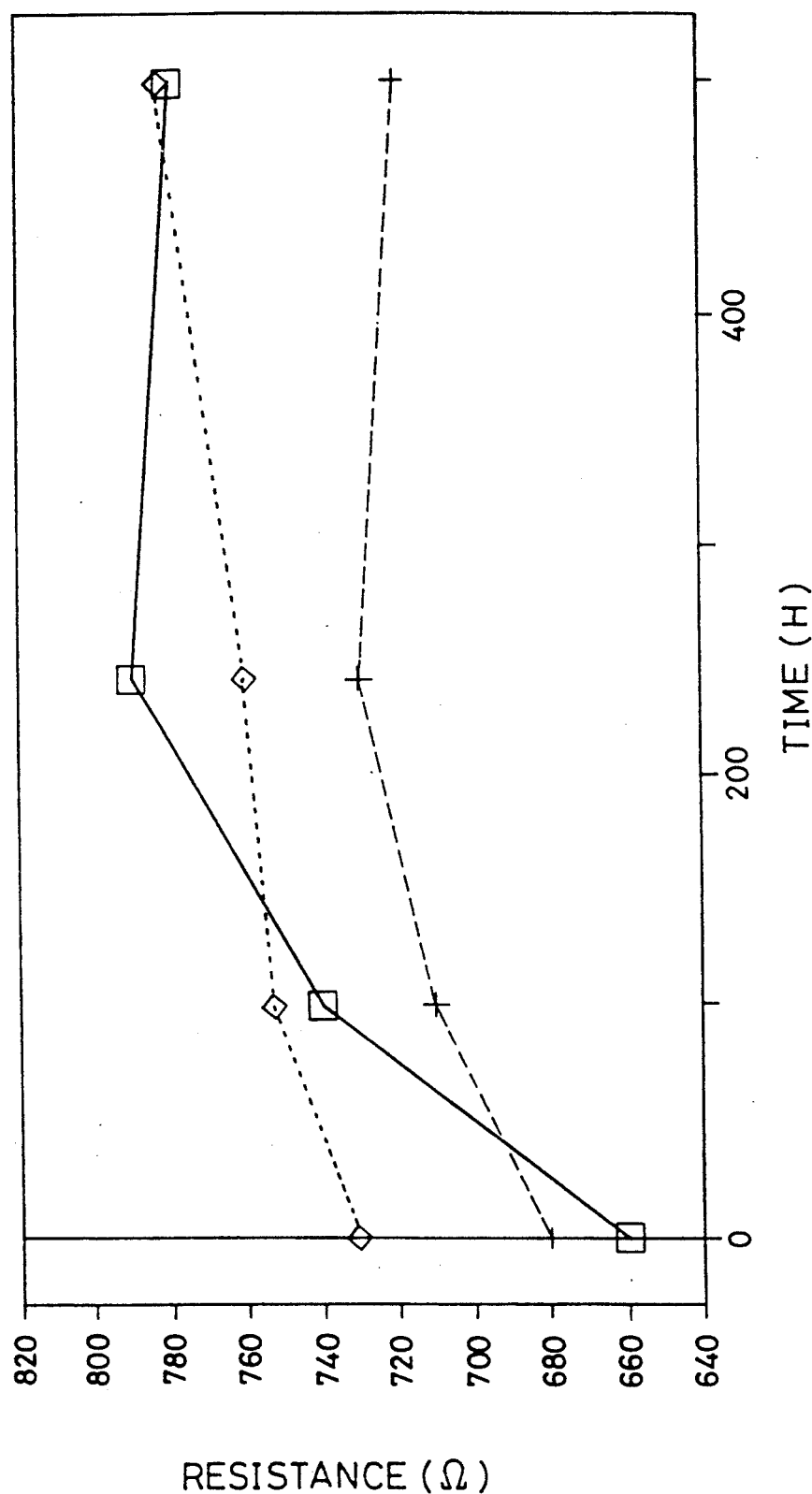
FIG. 10 is a graph showing a change in resistance value of the transparent electrode in a test in which the connecting terminal portions are left at high temperature and humidity after the connecting terminal portion of the substrate of the liquid crystal display element processed in accordance with the present invention is connected to the connecting terminal portion of the driving circuit substrate.

FIG. 10 is a graph showing the results of a test in which a connecting structure of the transparent electrode terminal portion of the liquid crystal display element having the protecting film in the above first embodiment of the present invention is left at high temperature and humidity such as 60° C. and 90% RH. In FIG. 10, a square □ relating to no processing shows the test results obtained in the conventional electrode connecting device having no protecting film. A plus × relating to processing solution 1 shows the test results of obtained in the electrode connecting device of the present invention using polyurethane resin as a basic material. A rhombus ◊ relating to processing solution 2 shows the test results obtained in the electrode connecting device of the present invention using polyolefin resin as a basic material.

As can be seen from this graph, an increase in resistance value of the transparent electrode in the above first embodiment of the present invention is clearly restrained at an initial stage in comparison with the conventional electrode connecting device. In both cases of the processing solutions 1 and 2 in the above first embodiment of the present invention, the transparent electrode has a resistance value higher than that in the case of no processing at time 0. This is because a connecting resistance of the transparent electrode is increased by the protecting film. However, there is no problem about such an increase in connecting resistance since a liquid crystal display is of a voltage driving type. After 500 hours have passed, the resistance value in the case of the processing solution 1 is stabilized in a low state in comparison with that in the case of no processing, besides a difference in the resistance value in the case of the processing solution 2 is less than that in the case of no processing. Accordingly, in the present invention using the protecting film, it is possible to restrain the resistance value of the transparent electrode from being increased at an initial stage and improve reliability of the electrode connecting device for a long period.

Figure 9:
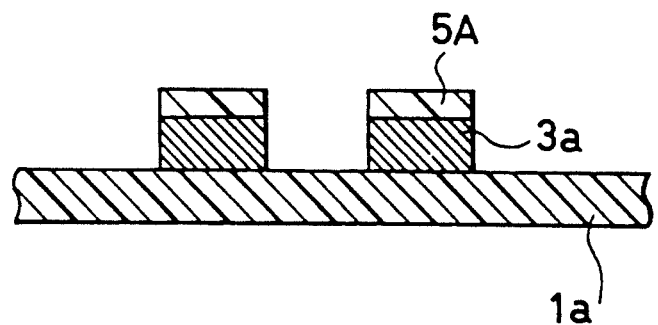
FIG. 9 is a cross sectional view showing the connecting terminal portion of the transparent electrode in another embodiment of the present invention in which a protecting film is formed on one substrate of the liquid crystal display element shown in FIG. 5.

FIG. 9 shows an electrode connecting device of a liquid crystal display element in accordance with a second embodiment of the present invention. In this second embodiment, a protecting film 5A is disposed on only an upper face of a transparent electrode terminal portion 3a formed on a substrate 1a. In this case, the amount of a material of the protecting film 5A is reduced in comparison with that in the above first embodiment, thereby increasing yield of this material.

When the protecting film is colored, it is easy to align the protecting film with an opposite electrode on the side of a driving circuit substrate, thereby increasing efficiency of a connecting operation. Since the protecting film 5A is disposed on only the transparent electrode terminal portion 3a, no electrical insulation is required with respect to the protecting film 5A so that the range of a material used for the protecting film 5A is widened.

Similar to the first embodiment, such a protecting film 5A is thermally adhered through an anisotropic conductive film between an opposite electrode of the driving circuit substrate 8 and the substrate 1a having the protecting film 5A formed on the upper face of the transparent electrode terminal portion 3a.

Figure 11:
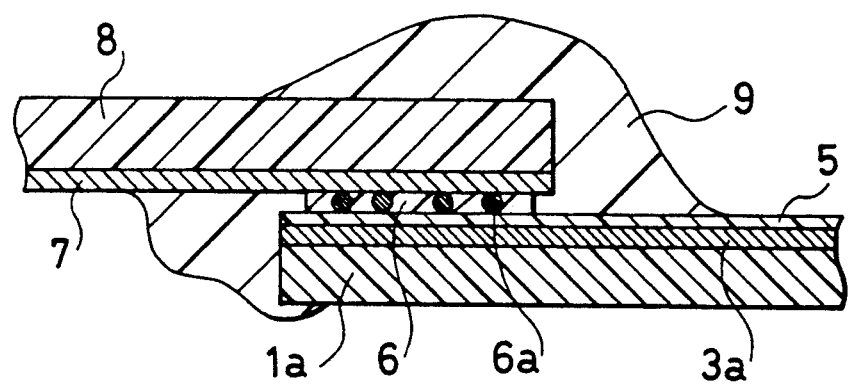
FIG. 11 is a cross sectional view showing a state in which a protecting film is formed around a connecting terminal portion of the liquid crystal display element in the present invention.

FIG. 11 shows a liquid crystal display element used in a liquid crystal display in accordance with a third embodiment of the present invention. Similar to the second embodiment of the present invention, a protecting film 5 is formed on a transparent electrode terminal portion 3a and is thermally adhered through an anisotropic conductive film 6 between the protecting film 5 and the connecting terminal portion of an opposite electrode 7. A peripheral portion of this electrode connecting terminal portion is covered with an external protecting film 9.

In accordance with this third embodiment, since the peripheral portion of the electrode connecting terminal portion is covered with the protecting film 9, reliability of the transparent electrode is improved by the internal protecting film 5 and strength of the transparent electrode against an external mechanical force is improved by the external protecting film 9.

As mentioned above, in accordance with the construction of an electrode connecting device of a liquid crystal display element in the present invention, it is possible to restrain an increase in connecting resistance value of each of a transparent electrode connecting terminal portion of the liquid crystal display element and an opposite electrode of a driving circuit substrate. Accordingly, it is possible to prevent disconnection and deterioration of the connecting terminal portion caused by a thermal press-fixing stress and improve reliability of the connecting terminal portion for a long period.

Many widely different embodiments of the present invention may be constructed without departing from the spirit and scope of the present invention. It should be understood that the present invention is not limited to the specific embodiments described in the specification, except as defined in the appended claims.

What is claimed is:

1. An electrode connecting device of a liquid crystal display element for connecting a transparent electrode terminal formed on a substrate constructed by a flexible film to an electrode terminal of a driving circuit and an external circuit through an anisotropic conductive film, said electrode connecting device comprising:

a protecting film formed on a surface of a connecting portion on which the transparent electrode terminal is formed;

the protecting film being able to absorb stress applied to the transparent electrode at a thermal press-fixing time and move conductive particles within the anisotropic conductive film; and both said electrodes being electrically connected to each other through the conductive particles within the anisotropic conductive film extending through said protecting film.

2. An electrode connecting device of a liquid crystal display element as claimed in claim 1, wherein a thickness of said protecting film is smaller than a diameter of each of the conductive particles.

3. An electrode connecting device of a liquid crystal display element as claimed in claim 1, wherein a basic material of said protecting film is made of polyurethane resin or polyolefin resin.

4. An electrode connecting device of a liquid crystal display element as claimed in claim 1, wherein said protecting film is disposed on only the transparent electrode.

5. An electrode connecting device of a liquid crystal display element as claimed in claim 1, wherein said protecting film is colored.

6. An electrode connecting device of a liquid crystal display element as claimed in claim 1, wherein said protecting film is formed by an electric insulating material.

7. An electrode connecting device of a liquid crystal display element as claimed in claim 1, wherein a peripheral substrate portion around both the connected electrodes is covered with another protecting film.

8. An electrode connecting device of a liquid crystal display element for connecting a transparent electrode terminal formed on a substrate constructed by a flexible film to an electrode terminal of a driving circuit and an external circuit through an anisotropic conductive film, said electrode connecting device comprising:

a protecting film formed on a surface of a connecting portion on which the transparent electrode terminal is formed;

the protecting film being able to absorb stress applied to the transparent electrode at a thermal press-fixing time and move conductive particles within the anisotropic conductive film;

both said electrodes being electrically connected to each other through the conductive particles within the anisotropic conductive film extending through said protecting film; and a peripheral substrate portion around both the connected electrodes being covered with another protecting film.

* * * * *